US011927647B2

(12) United States Patent
Takenaka et al.

(10) Patent No.: US 11,927,647 B2
(45) Date of Patent: Mar. 12, 2024

(54) CURRENT MEASUREMENT DEVICE, CURRENT MEASUREMENT METHOD, AND NON-TRANSITORY COMPUTER READABLE STORAGE MEDIUM

(71) Applicant: Yokogawa Electric Corporation, Tokyo (JP)

(72) Inventors: Kazuma Takenaka, Musashino (JP); Minako Terao, Musashino (JP); Kotaro Ogawa, Musashino (JP); Saki Kobako, Musashino (JP); Naoki Noguchi, Musashino (JP)

(73) Assignee: Yokogawa Electric Corporation, Tokyo (JP)

( * ) Notice: Subject to any disclaimer, the term of this patent is extended or adjusted under 35 U.S.C. 154(b) by 201 days.

(21) Appl. No.: 17/637,895

(22) PCT Filed: Aug. 25, 2020

(86) PCT No.: PCT/JP2020/031937
§ 371 (c)(1),
(2) Date: Feb. 24, 2022

(87) PCT Pub. No.: WO2021/039755
PCT Pub. Date: Mar. 4, 2021

(65) Prior Publication Data
US 2022/0283247 A1  Sep. 8, 2022

(30) Foreign Application Priority Data
Aug. 27, 2019 (JP) .................. 2019-154561

(51) Int. Cl.
*G01R 33/028* (2006.01)
*G01R 15/20* (2006.01)
(Continued)

(52) U.S. Cl.
CPC ....... *G01R 33/0283* (2013.01); *G01R 15/202* (2013.01); *G01R 33/072* (2013.01); *G01R 33/091* (2013.01)

(58) Field of Classification Search
CPC ............. G01R 33/0283; G01R 15/202; G01R 33/072; G01R 33/091; G01R 15/18; G01R 33/0206; G01R 15/20; G01R 15/207; G01R 33/0005; G01R 33/0029
USPC ......................................................... 324/244
See application file for complete search history.

(56) References Cited

U.S. PATENT DOCUMENTS

| | | | |
|---|---|---|---|
| 2011/0202295 A1 | 8/2011 | Tamura et al. | |
| 2015/0042318 A1* | 2/2015 | Youm | G01R 35/00 324/202 |

(Continued)

FOREIGN PATENT DOCUMENTS

| | | |
|---|---|---|
| JP | 2005-55300 A | 3/2005 |
| JP | 2011-164019 A | 8/2011 |

(Continued)

OTHER PUBLICATIONS

Translation of Written Opinion (Year: 2022).*

*Primary Examiner* — Christopher P Mcandrew
(74) *Attorney, Agent, or Firm* — RANKIN, HILL & CLARK LLP

(57) ABSTRACT

A current measurement device (1 and 2) is for measuring a current (I) flowing through measurement target conductors (MC1 and MC2), and the current measurement device includes: a plurality of triaxial magnetic sensors (11, 12, and 13) disposed so that a magnetic sensing direction and a relative position have a prescribed relationship; a noise remover (25*a*) configured to remove noise components included in detection results of the plurality of triaxial magnetic sensors; a sign adder (25*b*) configured to add a sign to the detection results from which the noise components have been removed, based on sign information of each of the detection results of the plurality of triaxial magnetic sensors (Continued)

obtained at a specific point in time; and a current calculator (25*c* and 25*d*) configured to calculate a current flowing through the measurement target conductors by using the detection results to which the sign has been added by the sign adder.

20 Claims, 10 Drawing Sheets

(51) Int. Cl.
*G01R 33/07* (2006.01)
*G01R 33/09* (2006.01)

(56) References Cited

U.S. PATENT DOCUMENTS

| | | | |
|---|---|---|---|
| 2015/0204919 A1* | 7/2015 | Akimoto | G01R 15/207 |
| | | | 324/244 |
| 2016/0116552 A1* | 4/2016 | Jahns | G01R 33/06 |
| | | | 324/244 |
| 2017/0234940 A1* | 8/2017 | Langfelder | G01R 33/028 |
| | | | 324/244 |
| 2021/0088557 A1 | 3/2021 | Takenaka et al. | |

FOREIGN PATENT DOCUMENTS

| | | |
|---|---|---|
| JP | 2019-152481 A | 9/2019 |
| JP | 2019-152607 A | 9/2019 |

\* cited by examiner

FIG. 7

| TIME | TRIAXIAL MAGNETIC SENSOR 11 | | | TRIAXIAL MAGNETIC SENSOR 12 | | | TRIAXIAL MAGNETIC SENSOR 13 | | |
|---|---|---|---|---|---|---|---|---|---|
| | FIRST AXIS | SECOND AXIS | THIRD AXIS | FIRST AXIS | SECOND AXIS | THIRD AXIS | FIRST AXIS | SECOND AXIS | THIRD AXIS |
| t0 | −Da10 | +Da20 | +Da30 | +Db10 | −Db20 | −Db30 | −Dc10 | −Dc20 | −Dc30 |
| t1 | +Da11 | +Da21 | +Da31 | +Db11 | −Db21 | −Db31 | −Dc11 | −Dc21 | −Dc31 |
| t2 | +Da12 | +Da22 | +Da32 | +Db12 | −Db22 | −Db32 | −Dc12 | −Dc22 | −Dc32 |
| t3 | +Da13 | +Da23 | +Da33 | +Db13 | −Db23 | −Db33 | −Dc13 | −Dc23 | −Dc33 |
| t4 | −Da14 | +Da24 | +Da34 | +Db14 | −Db24 | −Db34 | −Dc14 | −Dc24 | −Dc34 |
| t5 | −Da15 | −Da25 | −Da35 | −Db15 | +Db25 | +Db35 | +Dc15 | +Dc25 | +Dc35 |
| t6 | −Da16 | −Da26 | −Da36 | −Db16 | +Db26 | +Db36 | +Dc16 | +Dc26 | +Dc36 |
| t7 | −Da17 | −Da27 | −Da37 | −Db17 | +Db27 | +Db37 | +Dc17 | +Dc27 | +Dc37 |
| t8 | −Da18 | −Da28 | −Da38 | −Db18 | +Db28 | +Db38 | +Dc18 | +Dc28 | +Dc38 |
| t9 | −Da19 | −Da29 | −Da39 | −Db19 | +Db29 | +Db39 | +Dc19 | +Dc29 | +Dc39 |
| ... | ... | ... | ... | ... | ... | ... | ... | ... | ... |
| NOISE-REMOVED DETECTION DATA | D11 | D12 | D13 | D21 | D22 | D23 | D31 | D32 | D33 |
| SIGN-ADDED DETECTION DATA | +D11 | +D12 | +D13 | +D21 | −D22 | −D23 | −D31 | −D32 | −D33 |

CURRENT MEASUREMENT DEVICE, CURRENT MEASUREMENT METHOD, AND NON-TRANSITORY COMPUTER READABLE STORAGE MEDIUM

TECHNICAL FIELD

The present invention relates to a current measurement device, a current measurement method, and a non-transitory computer readable storage medium.

BACKGROUND ART

Conventionally, various current measurement devices capable of measuring a current flowing through a measurement target conductor in a non-contact manner have been developed. Examples of a representative current measurement device may include a current transformer (CT) type current measurement device, a zero flux type current measurement device, a Rogowski type current measurement device, and a Hall element type current measurement device.

For example, the CT type current measurement device and the zero flux type current measurement device measure a current flowing through a measurement target conductor by providing a magnetic core with windings wound therearound around a measurement target conductor and detecting a current flowing in the windings (a secondary side) in order to cancel a magnetic flux generated in the magnetic core due to a current flowing through the measurement target conductor (a primary side). Further, the Rogowski type current measurement device measures a current flowing through a measurement target conductor by detecting a voltage induced by a magnetic field generated due to an AC current flowing through the measurement target conductor interlinking with a Rogowski coil (an air core coil) provided around the measurement target conductor.

Patent Literature 1 below discloses an example of a zero flux type current measurement device. Further, Patent Literature 2 below discloses a current measurement device using a plurality of magnetic sensors. Specifically, the current measurement device disclosed in Patent Literature 2 below includes two magnetic sensors disposed at different distances from a measurement target conductor, obtains distances between the magnetic sensors and the measurement target conductor from outputs of the magnetic sensors, and obtains a magnitude of a current flowing through the measurement target conductor using the obtained distances.

CITATION LIST

Patent Literature

[Patent Literature 1]
Japanese Unexamined Patent Application Publication No. 2005-55300
[Patent Literature 2]
Japanese Unexamined Patent Application Publication No. 2011-164019

SUMMARY OF INVENTION

Technical Problem

Incidentally, in a current measurement device using a magnetic sensor, processing of removing noise included in detection results of the magnetic sensor may be performed in order to improve measurement accuracy for a current. Examples of the processing of removing noise include processing of averaging absolute values of the detection results of the magnetic sensor (averaging processing), and processing of obtaining a square root of sum of squares of the detection results of the magnetic sensor (square root of sum of squares processing).

Because a sign of the detection result of the magnetic sensor is always positive when such noise removal processing is performed, information indicating a direction of the magnetic field may be lost. When the information indicating the direction of the magnetic field is lost, it is conceivable that an erroneous value be measured or current measurement itself be not possible in some cases.

The present invention has been made in view of the above circumstances, and an object of the present invention is to provide a current measurement device, a current measurement method, and a non-transitory computer readable storage medium capable of accurately measuring a current flowing through a measurement target conductor in a non-contact manner regardless of there being a direct current or an alternating current.

Solution to Problem

In order to solve the above problem, a current measurement device according to an aspect of the present invention is a current measurement device (1 and 2) for measuring a current (I) flowing through measurement target conductors (MC1 and MC2), the current measurement device including: a plurality of triaxial magnetic sensors (11, 12, and 13) disposed so that a magnetic sensing direction and a relative position have a prescribed relationship; a noise remover (25a) configured to remove noise components included in detection results of the plurality of triaxial magnetic sensors; a sign adder (25b) configured to add a sign to the detection results from which the noise components have been removed, based on sign information of each of the detection results of the plurality of triaxial magnetic sensors obtained at a specific point in time; and a current calculator (25c and 25d) configured to calculate a current flowing through the measurement target conductors by using the detection results to which the sign has been added by the sign adder.

Further, the current measurement device according to an aspect of the present invention further includes a storage (23) configured to store the detection results of the plurality of triaxial magnetic sensors in a prescribed period, wherein the sign adder adds the sign to the detection result from which the noise component has been removed based on the sign information of each of the detection results of the plurality of triaxial magnetic sensors at a point in time when a detection result whose an absolute value is maximized has been obtained among the detection results stored in the storage.

Further, the current measurement device according to the aspect of the present invention, further including: a zero setter (25e) configured to set a value of the detection result whose value is equal to or smaller than a preset threshold value among the detection results of the plurality of triaxial magnetic sensors to zero.

Further, the current measurement device according to the aspect of the present invention, wherein the noise remover individually performs averaging processing or the square root of sum of squares processing on the detection results of respective axes of the plurality of triaxial magnetic sensors obtained at prescribed fixed periods to remove the noise components included in the detection results of the plurality of triaxial magnetic sensors.

Further, the current measurement device according to the aspect of the present invention, wherein the current calculator includes a distance estimator (25c) configured to estimate a distance between a prescribed reference position of the current measurement device and the measurement target conductors using the detection results to which the sign has been added by the sign adder; and a current calculator (25d) configured to calculate the current flowing through the measurement target conductors using the distance estimated by the distance estimator.

Further, the current measurement device according to the aspect of the present invention includes a sensor head (10) including the plurality of triaxial magnetic sensors, and a circuit (20) including at least the noise remover, the sign adder, and the current calculator.

Further, the current measurement device according to the aspect of the present invention, wherein the sensor head includes a first triaxial magnetic sensor (11), a second triaxial magnetic sensor (12), and a third triaxial magnetic sensor (13), the first triaxial magnetic sensor, the second triaxial magnetic sensor, and the third triaxial magnetic sensor are magnetic sensors having magnetic sensing directions on three axes orthogonal to each other, and the first triaxial magnetic sensor, the second triaxial magnetic sensor, and the third triaxial magnetic sensor are disposed so that a magnetic sensing direction and a relative position have a prescribed relationship.

In order to solve the above problem, a current measurement method according to an aspect of the present invention is a current measurement method executed by a current measurement device (1 and 2) including a plurality of triaxial magnetic sensors (11, 12, and 13) disposed so that a magnetic sensing direction and a relative position have a prescribed relationship, a noise remover (25a), a sign adder (25b), and a current calculator (25c and 25d) to measure a current (I) flowing through measurement target conductors (MC1 and MC2), the current measurement method including: removing, by the noise remover, noise components included in detection results of the plurality of triaxial magnetic sensors; adding, by the sign adder, a sign to the detection results from which the noise components have been removed, based on sign information of each of the detection results of the plurality of triaxial magnetic sensors obtained at a specific point in time; and obtaining, by the current calculator, a current flowing through the measurement target conductors by using the detection results to which the sign has been added by the sign adder.

Further, the current measurement method according to the aspect of the present invention, wherein the current measurement device further includes a storage (23), the current measurement method includes storing, by the storage, the detection results of the plurality of triaxial magnetic sensors in a prescribed period; and adding, by the sign adder, the sign to the detection results from which the noise components have been removed based on the sign information of each of the detection results of the plurality of triaxial magnetic sensors at a point in time when a detection result whose an absolute value is maximized has been obtained among the detection results stored in the storage.

Further, the current measurement method according to the aspect of the present invention, wherein the current measurement device further includes: a zero setter (25e), and the current measurement method includes setting, by the zero setter, a value of a detection result whose value is equal to or smaller than a preset threshold value among the detection results of the plurality of triaxial magnetic sensors to zero.

Further, the current measurement method according to the aspect of the present invention includes individually performing, by the noise remover, averaging processing or square root of sum of squares processing on the detection results of respective axes of the plurality of triaxial magnetic sensors obtained at prescribed fixed periods to remove the noise components included in the detection results of the plurality of triaxial magnetic sensors.

Further, the current measurement method according to the aspect of the present invention, wherein the current calculator includes a distance estimator (25c) and a current calculator (25d), and the current measurement method includes estimating, by the distance estimator, a distance between a prescribed reference position of the current measurement device and the measurement target conductor using the detection results to which the sign has been added by the sign adder; and calculating, by the current calculator, the current flowing through the measurement target conductor using the distance estimated by the distance estimator.

Further, the current measurement method according to the aspect of the present invention, wherein the current measurement device further includes a sensor head (10) including the plurality of triaxial magnetic sensors, and a circuit (20) including at least the noise remover, the sign adder, and the current calculator.

Further, the current measurement method according to the aspect of the present invention, wherein the sensor head includes a first triaxial magnetic sensor (11), a second triaxial magnetic sensor (12), and a third triaxial magnetic sensor (13), the first triaxial magnetic sensor, the second triaxial magnetic sensor, and the third triaxial magnetic sensor are magnetic sensors having magnetic sensing directions on three axes orthogonal to each other, and the first triaxial magnetic sensor, the second triaxial magnetic sensor, and the third triaxial magnetic sensor are disposed so that a magnetic sensing direction and a relative position have a prescribed relationship.

In order to solve the above problem, a non-transitory computer readable storage medium according to an aspect of the present invention is a non-transitory computer readable storage medium storing one or more programs executed by a current measurement device (1 and 2) including a plurality of triaxial magnetic sensors (11, 12, and 13) disposed so that a magnetic sensing direction and a relative position have a prescribed relationship, a noise remover (25a), a sign adder (25b), and a current calculator (25c and 25d) to measure a current (I) flowing through measurement target conductors (MC1 and MC2), the one or more programs instructing the current measurement device to: remove, by the noise remover, noise components included in detection results of the plurality of triaxial magnetic sensors; add, by the sign adder, a sign to the detection results from which the noise components have been removed, based on sign information of each of the detection results of the plurality of triaxial magnetic sensors obtained at a specific point in time; and calculate, by the current calculator, a current flowing through the measurement target conductors by using the detection results to which the sign has been added by the sign adder.

Further, the non-transitory computer readable storage medium according to the aspect of the present invention, wherein the current measurement device further includes a storage (23), and the one or more programs further instructs the current measurement device to: store, by the storage, the detection results of the plurality of triaxial magnetic sensors in a prescribed period; and add, by the sign adder, the sign to the detection results from which the noise components have been removed based on the sign information of each of the detection results of the plurality of triaxial magnetic sensors at a point in time when a detection result whose an absolute value is maximized has been obtained among the detection results stored in the storage.

Further, the non-transitory computer readable storage medium according to the aspect of the present invention, wherein the current measurement device further includes: a zero setter (25e), and the one or more programs further instructs the current measurement device to: set, by the zero setter, a value of a detection result whose value is equal to or smaller than a preset threshold value among the detection results of the plurality of triaxial magnetic sensors to zero.

Further, the non-transitory computer readable storage medium according to the aspect of the present invention, the one or more programs further instructs the current measurement device to: individually perform, by the noise remover, averaging processing or square root of sum of squares processing on the detection results of respective axes of the plurality of triaxial magnetic sensors obtained at prescribed fixed periods to remove the noise components included in the detection results of the plurality of triaxial magnetic sensors.

Further, the non-transitory computer readable storage medium according to the aspect of the present invention, wherein the current calculator includes a distance estimator (25c) and a current calculator (25d), and the one or more programs further instructs the current measurement device to: estimate, by the distance estimator, a distance between a prescribed reference position of the current measurement device and the measurement target conductor using the detection results to which the sign has been added by the sign adder; and calculate, by the current calculator, the current flowing through the measurement target conductor using the distance estimated by the distance estimator.

Further, the non-transitory computer readable storage medium according to the aspect of the present invention, wherein the current measurement device further includes a sensor head (10) including the plurality of triaxial magnetic sensors, and a circuit (20) including at least the noise remover, the sign adder, and the current calculator.

Advantageous Effects of Invention

According to the present invention, there is an effect that it is possible to accurately measure the current flowing through the measurement target conductor in a non-contact manner regardless of a direct current or alternating current.

BRIEF DESCRIPTION OF DRAWINGS

FIG. 7 is a diagram illustrating processing that is performed in the first embodiment of the present invention.

DESCRIPTION OF EMBODIMENTS

Figure 1:
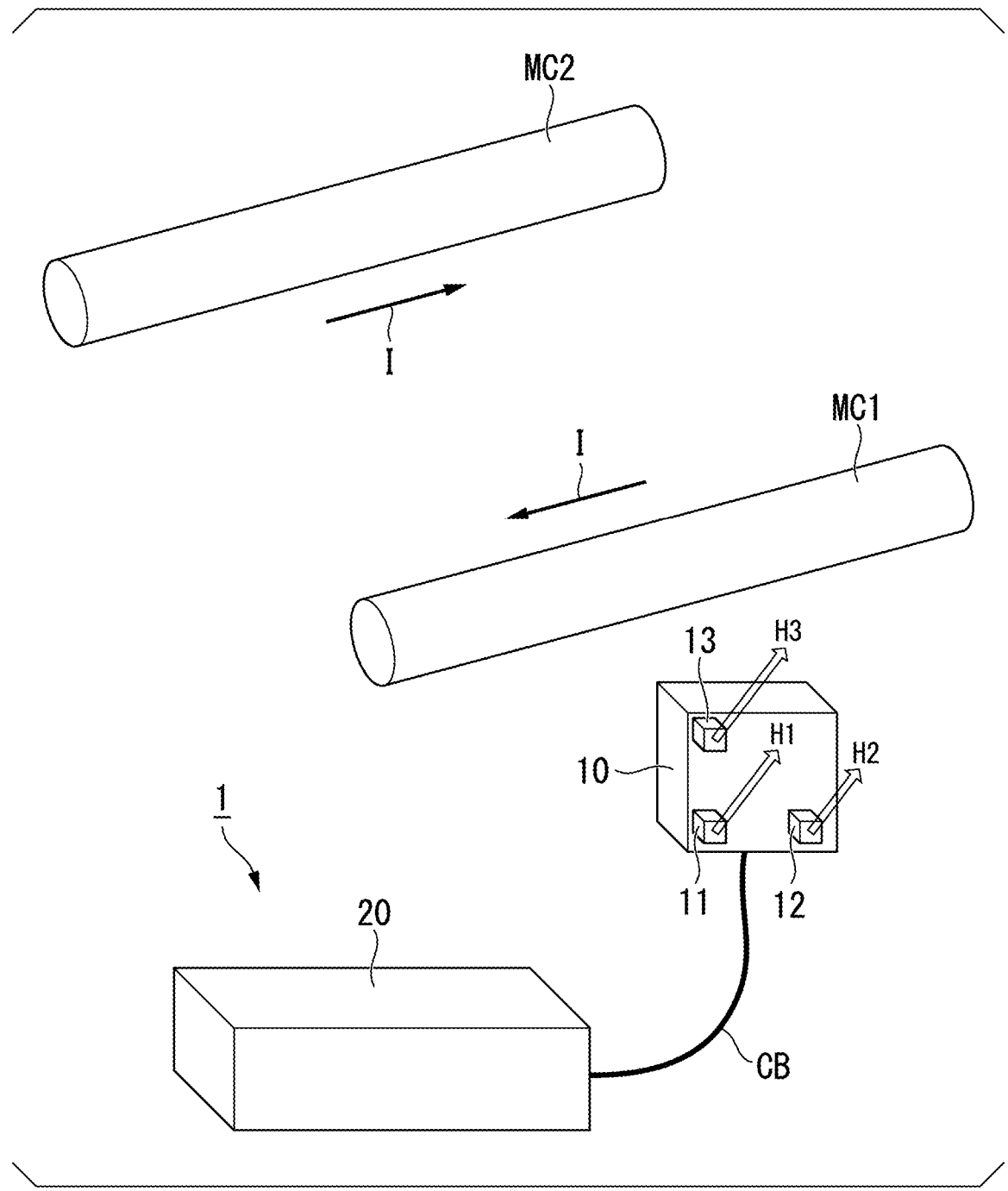
FIG. 1 is a diagram schematically illustrating a current measurement device according to a first embodiment of the present invention.

Hereinafter, a current measurement device according to an embodiment of the present invention will be described in detail with reference to the drawings. Hereinafter, an overview of the embodiment of the present invention will be first described, and then details of the embodiment of the present invention will be described.

[Overview]

The embodiment of the present invention makes it possible to accurately measure the current flowing through the measurement target conductor in a non-contact manner regardless of a direct current or alternating current. Specifically, the embodiment of the present invention makes installation in a small space at the time of current measurement possible, and makes it possible to accurately measure a direct current and an alternating current up to about hundreds of [Hz] in a non-contact manner. Further, the embodiment of the present invention also makes it possible to flexibly set an installation position or an installation direction with respect to a measurement target conductor.

In recent years, in the development process of hybrid vehicles (HV) and electric vehicles (EV), it has been required to measure a current flowing through pins of a power semiconductor such as silicon carbide (SiC) or a current flowing through a bus bar after assembly. Many power semiconductors have a narrow pin pitch, and the bus bar may be installed in a place in which a surrounding space is limited. Therefore, there is a demand for a current measurement device of which installation at the time of current measurement with respect to such a power semiconductor, bus bar, or the like can be flexibly performed. Further, in a hybrid vehicle or an electric vehicle, for example, since a direct current supplied from a battery or an alternating current flowing through a motor is handled, a compact current measurement device capable of measuring a direct current and an alternating current in a non-contact manner is desired.

However, in a zero flux type current measurement device disclosed in Patent Literature 1 described above, since it is necessary for a magnetic core having a certain size (for example, about tens of [cm]) to be provided around a measurement target conductor, installation in a small space is difficult. Further, since the Rogowski type current measurement device described above detects a voltage induced in the Rogowski coil, measurement of a direct current cannot be performed in principle. Further, in a low frequency domain, since an output signal is weak and a phase shifts, measurement accuracy is poor. Further, in the current measurement device disclosed in Patent Literature 2 described above, because it is necessary for a magnetic sensing direction of a magnetic sensor to match a circumferential direction of a measurement target conductor, disposition of the magnetic sensor is limited and flexible disposition is difficult.

In the embodiment of the present invention, a plurality of triaxial magnetic sensors disposed so that a magnetic sensing direction and a relative position have a prescribed relationship, and a noise remover configured to remove noise components included in detection results of the plurality of triaxial magnetic sensors are provided. A sign is added to the detection result from which the noise component has been removed, on the basis of sign information of each of the detection results of the plurality of triaxial magnetic sensors obtained at a specific point in time, and a current flowing through the measurement target conductor is obtained by using the detection result to which the sign has been added. Accordingly, it is possible to accurately measure the current flowing through the measurement target conductor in a non-contact manner regardless of a direct current or alternating current.

First Embodiment

<Configuration of Current Measurement Device>

FIG. 1 is a diagram schematically illustrating a current measurement device according to a first embodiment of the present invention. As illustrated in FIG. 1, the current measurement device 1 of the present embodiment includes a sensor head 10 and a circuit 20 connected by a cable CB, and measures a current I flowing through any one of measurement target conductors MC1 and MC2 in a non-contact manner. In the present embodiment, a case in which the current I flowing through the measurement target conductor MC1 is measured will be described by way of example.

The measurement target conductors MC1 and MC2 are arbitrary conductors such as pins and bus bars of power semiconductors. Hereinafter, it is assumed that the measurement target conductors MC1 and MC2 are cylindrical conductors, in order to simplify description. The current I flowing through the measurement target conductors MC1 and MC2 have opposite flowing directions. Hereinafter, a current path for the current flowing through the measurement target conductor MC1 may be referred to as an "outward path", and a current path for the current flowing through the measurement target conductor MC2 may be referred to as a "return path".

The sensor head 10 is a member that is disposed in any posture at any position with respect to the measurement target conductor MC1 in order to measure the current I flowing through the measurement target conductor MC1 in a non-contact manner. The sensor head 10 is formed of a material (for example, resin) that does not shield a magnetic field (for example, magnetic fields H1, H2, and H3 illustrated in FIG. 1) generated by the current I flowing through the measurement target conductors MC1 and MC2. The sensor head 10 is used as a probe for measuring the current I flowing through the measurement target conductor MC1 in a non-contact manner.

The sensor head 10 is provided with three triaxial magnetic sensors 11, 12, and 13. The triaxial magnetic sensors 11, 12, and 13 are magnetic sensors having magnetic sensing directions on three axes orthogonal to each other. The triaxial magnetic sensors 11, 12, and 13 are disposed so that the magnetic sensing direction and a relative position have a prescribed relationship. For example, the triaxial magnetic sensors 11, 12, and 13 are disposed to be separated by a predetermined distance in a predetermined direction so that first axes of the triaxial magnetic sensors 11, 12, and 13 are parallel to each other, second axes of the triaxial magnetic sensors 11, 12, and 13 are parallel to each other, and third axes of the triaxial magnetic sensors 11, 12, and 13 are parallel to each other. Hereinafter, it is assumed that the triaxial magnetic sensors 11 and 12 are arranged to be separated by a predetermined distance in a first axis direction, and the triaxial magnetic sensors 11 and 13 are arranged to be separated by a predetermined distance in the third axis direction.

A signal indicating detection result of the triaxial magnetic sensors 11, 12, and 13 may be any one of an analog signal and a digital signal, but when the signal indicating the detection result of the triaxial magnetic sensors 11, 12, and 13 is the digital signal, it is possible to reduce the number of cables CB connecting the sensor head 10 to the circuit 20. For example, when the signal indicating the detection result of the triaxial magnetic sensors 11, 12, and 13 is the analog signal, a total of nine cables CB are necessary because three cables CB for outputting detection results of three axes are necessary for each of the triaxial magnetic sensors 11, 12, and 13, whereas when the signal indicating the detection result of the triaxial magnetic sensors 11, 12, and 13 is the digital signal, only one cable CB may be necessary. Since the flexibility of the cables CB is improved when the number of cables CB is small, it becomes easy for the sensor head 10 to be handled, for example, when the sensor head 10 is disposed in a small space.

The circuit 20 measures the current I flowing through the measurement target conductor MC1 on the basis of the detection result output from the sensor head 10 (detection results of the triaxial magnetic sensors 11, 12, and 13). The circuit 20 displays a measurement result for the current I or outputs the measurement result to the outside. The circuit 20 is realized by, for example, a field-programmable gate array (FPGA), an application specific integrated circuit (ASIC), or a microcontroller. Any cables can be used as the cables CB for connecting the sensor head 10 to the circuit 20, but it is preferable for cables having flexibility, being easy to handle, and being difficult to be disconnected to be used.

Figure 2:
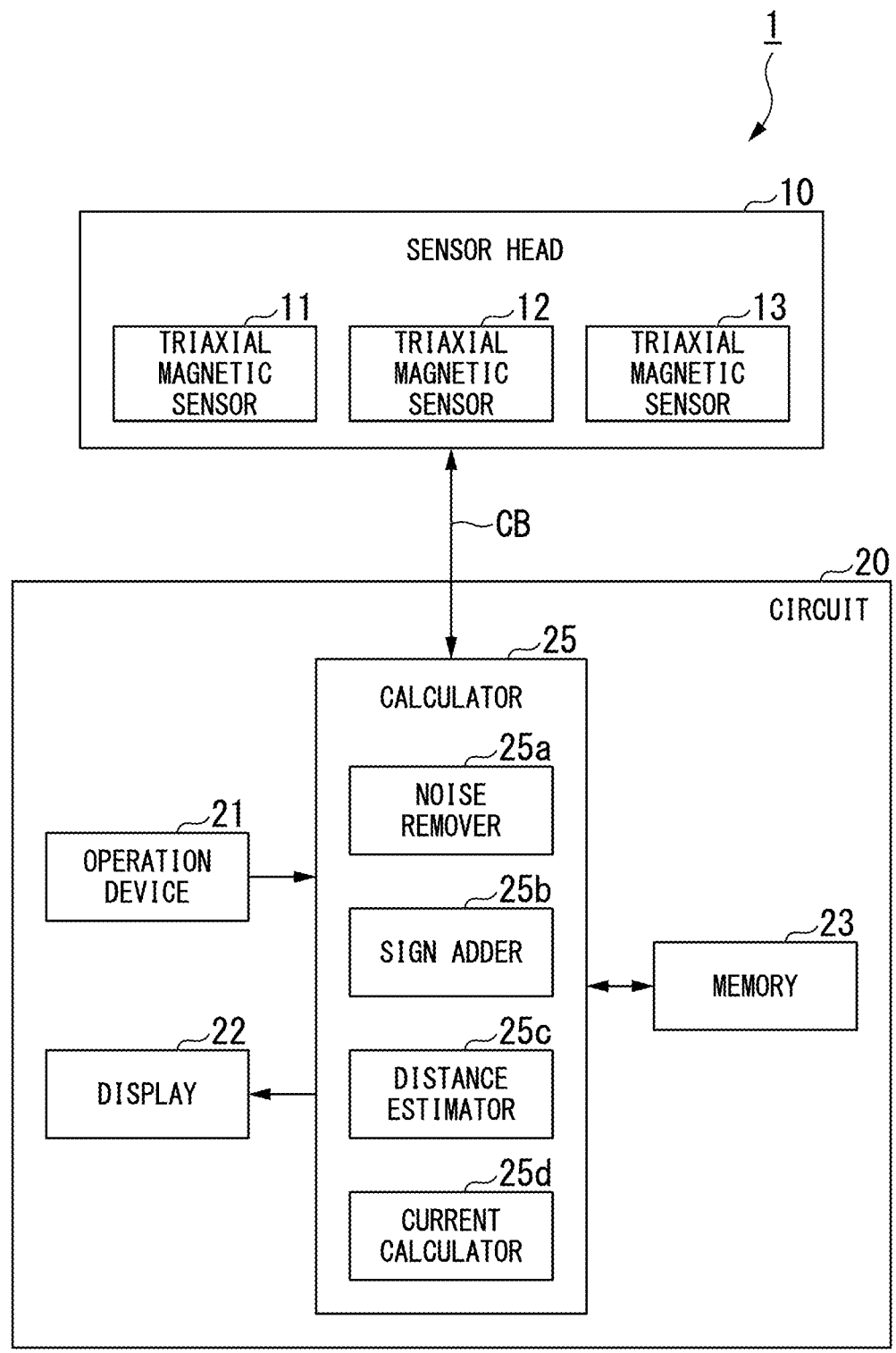
FIG. 2 is a block diagram illustrating a main configuration of a current measurement device according to the first embodiment of the present invention.

FIG. 2 is a block diagram illustrating a main configuration of a current measurement device according to the first embodiment of the present invention. In FIG. 2, blocks corresponding to those in the configuration illustrated in FIG. 1 are denoted by the same reference signs. Hereinafter, details of an internal configuration of the circuit 20 will be mainly described with reference to FIG. 2. As illustrated in FIG. 2, the circuit 20 includes an operation device 21, a display 22, a memory 23 (storage), and a calculator 25.

The operation device 21 includes various buttons such as a power button and a setting button, and outputs signals indicating operation instructions with respect to the various buttons to the calculator 25. The display 22 includes, for example, a display device such as a 7-segment light emitting diode (LED) display or a liquid crystal display device, and displays various types of information (for example, information indicating the measurement result for the current I flowing through the measurement target conductor MC1) output from the calculator 25. The operation device 21 and the display 22 may be physically separate or may be physically integrated as in a touch panel type liquid crystal display device having both a display function and an operation function.

The memory 23 includes, for example, a volatile or non-volatile semiconductor memory, and stores the detection results of the triaxial magnetic sensors 11, 12, and 13 output from the sensor head 10, a calculation result (the measurement result of the current I flowing through the measurement target conductor MC1) of the calculator 25, and the like. The memory 23 may include, for example, an auxiliary storage device such as a hard disk drive (HDD) or solid state drive (SSD), in addition to the semiconductor memory (or instead of the semiconductor memory).

The calculator 25 stores the detection results of the triaxial magnetic sensors 11, 12, and 13 output from the sensor head 10 in the memory 23. Specifically, the calculator 25 stores time information indicating a detection time, information indicating sensor numbers of the triaxial magnetic sensors 11, 12, and 13, and information indicating an identification of the axes (the first axis, the second axis, and the third axis), in addition to the detection results of the triaxial magnetic sensors 11, 12, and 13 in the memory 23.

Further, the calculator 25 reads the detection results of the triaxial magnetic sensors 11, 12, and 13 stored in the memory 23, and performs calculation for obtaining the current I flowing through the measurement target conductor MC1. As illustrated in FIG. 2, the calculator 25 includes a noise remover 25a, a sign adder 25b, a distance estimator 25c (a current calculator), and a current calculator 25d (a current calculator).

The noise remover 25a removes noise components included in the detection results of the triaxial magnetic sensors 11, 12, and 13. Specifically, the noise remover 25a removes the noise components included in the detection results of the triaxial magnetic sensors 11, 12, and 13 by individually performing averaging processing or square root of sum of squares processing on the detection results of the respective axes of the triaxial magnetic sensors 11, 12, and 13 obtained at prescribed fixed periods (for example, about one to several seconds).

The averaging processing is processing of obtaining an average value of absolute values of a plurality of detection results obtained from the triaxial magnetic sensors 11, 12, and 13. The averaging processing may be simple averaging processing, moving averaging processing, or weighted averaging processing. The detection results of the three axes are output from the triaxial magnetic sensors 11, 12, and 13, respectively, but the removal of the noise components by the noise remover 25a are individually performed on the detection results of the respective axes. Such noise removal is performed to improve an SN ratio (signal-to-noise ratio) of the triaxial magnetic sensors 11, 12, and 13 to increase the measurement accuracy for the current I.

The sign adder 25b adds a sign to the detection result from which the noise component has been removed by the noise remover 25a. Specifically, the sign adder 25b adds a sign to the detection result from which the noise component has been removed by the noise remover 25a on the basis of sign information of each of the detection results of the triaxial magnetic sensors 11, 12, and 13 obtained at the specific point in time among the detection results of the triaxial magnetic sensors 11, 12, and 13. In the detection result from which the noise component has been removed by the noise remover 25a, information indicating a direction of the magnetic field may be lost. Processing of adding a sign in the sign adder 25b is performed in order to restore the lost information indicating the direction of the magnetic field.

The specific point in time may be any point in time while the sensor head 10 can be regarded as not moving during measurement of a current. However, when a value (absolute value) of the detection result of the triaxial magnetic sensors 11, 12, and 13 is small, concern that an erroneous sign is added due to an influence of noise is conceivable. Therefore, for example, a point in time at which the detection result having a maximum absolute value among the detection results of the triaxial magnetic sensors 11, 12, and 13 stored in the memory 23 is obtained in a prescribed period (for example, between one and several seconds) while the sensor head 10 can be regarded as not moving is preferably the specific point in time. Details of the processing performed by the sign adder 25b will be described below.

The distance estimator 25c calculates distance information indicating the distance between a prescribed reference position of the current measurement device 1 and the measurement target conductor MC1 by using the detection results of the triaxial magnetic sensors 11, 12, and 13 and a positional relationship among the triaxial magnetic sensors 11, 12, and 13. The reference position of the current measurement device 1 may be any position, but for example, the reference position may be attachment positions of the triaxial magnetic sensors 11, 12, and 13 in the sensor head 10. The estimation of such a distance is performed to measure the current I flowing through the measurement target conductor MC1. Details of processing that is performed by the distance estimator 25c will be described below.

The current calculator 25d obtains the current I flowing through the measurement target conductor MC1 by using the distance information calculated by the distance estimator 25c. Specifically, the current calculator 25d obtains the current I flowing through the measurement target conductor MC1 according to Ampere's law on the basis of the estimated distance of the triaxial magnetic sensor 11 and the detection result of the triaxial magnetic sensor 11. Details of the processing performed by the current calculator 25d will be described below.

Here, as illustrated in FIGS. 1 and 2, the circuit 20 is separated from the sensor head 10 and is connected to the sensor head 10 via the cable CB. With such a configuration, it is possible to separate a magnetic field detection function (the triaxial magnetic sensors 11, 12, 13) from a calculation function (the calculator 25), to avoid, for example, all problems (for example, temperature characteristics or insulation resistance) that occur when the calculator 25 is provided in the sensor head 10, and thus, to extend applications of the current measurement device 1.

<Principle of Current Measurement>

Figure 3:
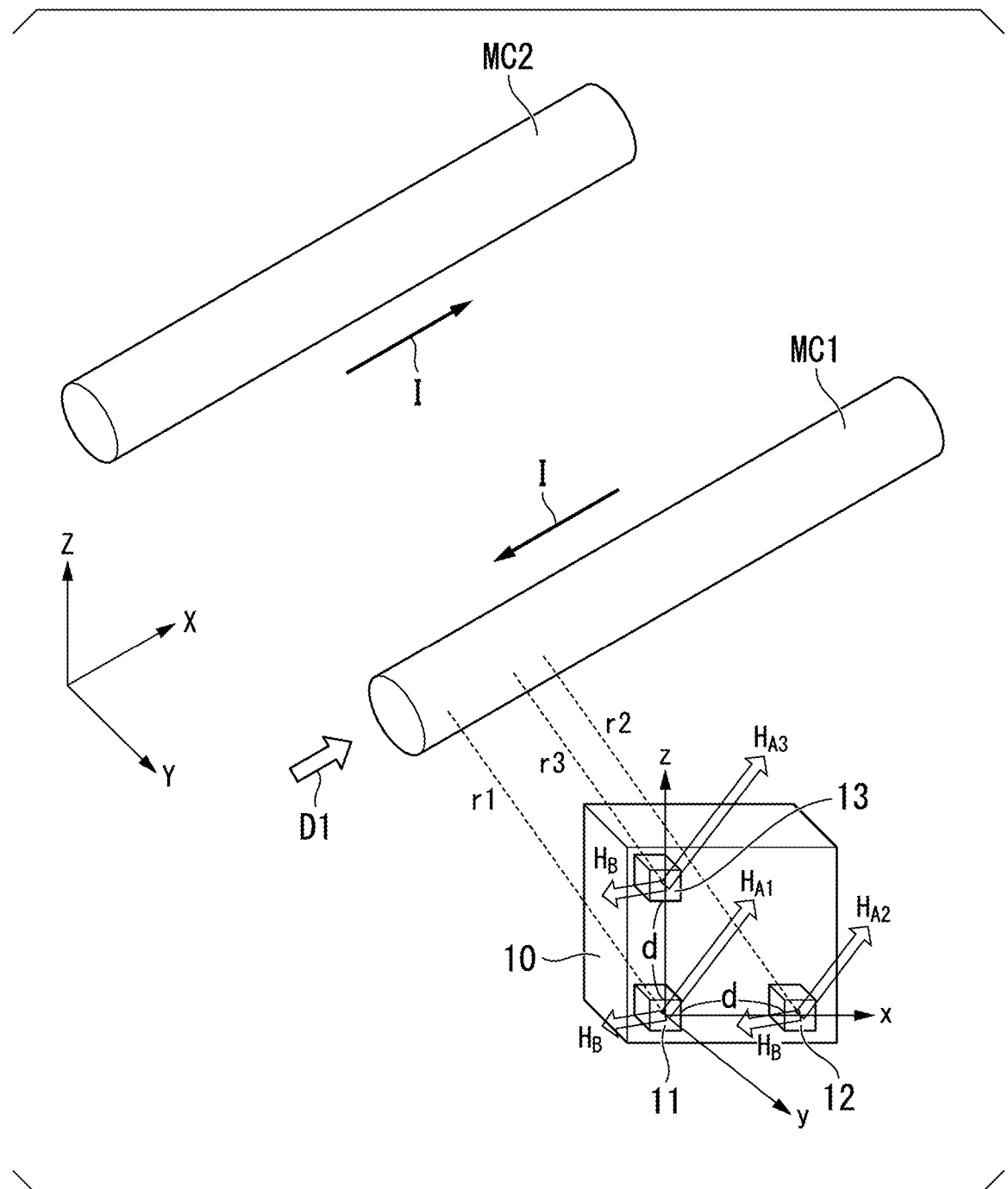
FIG. 3 is a diagram illustrating a current measurement principle in the current measurement device according to the first embodiment of the present invention.

Next, a principle of current measurement in the current measurement device 1 will be described. FIG. 3 is a diagram illustrating a current measurement principle in the current measurement device according to the first embodiment of the present invention. First, two coordinate systems including a coordinate system related only to the sensor head 10 (an xyz Cartesian coordinate system) and a coordinate system (an XYZ Cartesian coordinate system) related to the measurement target conductors MC1 and MC2 are set, as illustrated in FIG. 3.

The xyz Cartesian coordinate system is a coordinate system that is defined according to a position and posture of the sensor head 10. In this xyz Cartesian coordinate system, an origin is set at a position of the triaxial magnetic sensor 11, an x axis is set in a first axis direction of the triaxial magnetic sensors 11, 12, and 13 (an arrangement direction of the triaxial magnetic sensors 11 and 12), a y axis is set in a second axis direction of the triaxial magnetic sensors 11, 12, and 13, and a z axis is set in a third axis direction of the triaxial magnetic sensors 11, 12, and 13 (an arrangement direction of the triaxial magnetic sensors 11 and 13).

Here, the positions of the triaxial magnetic sensors 11, 12, and 13 are represented as Pi (i=1, 2, 3). Pi is a vector. That is, it is assumed that the position of the triaxial magnetic sensor 11 is represented by P1, the position of the triaxial magnetic sensor 12 is represented by P2, and the position of the triaxial magnetic sensor 13 is represented by P3. For example, as illustrated in FIG. 3, when a distance in an x direction between the triaxial magnetic sensors 11 and 12 and a distance in a z direction between the triaxial magnetic sensors 11 and 13 are d [m], the positions of the triaxial magnetic sensors 11, 12, and 13 are represented as follows.

Position of triaxial magnetic sensor 11: P1=(0, 0, 0)
Position of triaxial magnetic sensor 12: P2=(d, 0, 0)
Position of triaxial magnetic sensor 13: P3=(0, 0, d)

The XYZ coordinate system is a coordinate system defined according to the measurement target conductors MC1 and MC2. In this XYZ Cartesian coordinate system, an X axis is set in a longitudinal direction (a direction of the current I) of the measurement target conductors MC1 and MC2, and a Y axis is set in an arrangement direction of the measurement target conductors MC1 and MC2. The Z axis is set in a direction orthogonal to the X axis and the Y axis. An origin position of the XYZ Cartesian coordinate system can be set to any position.

As illustrated in FIG. 3, a distance of the triaxial magnetic sensor 11 to the measurement target conductor MC1 is r1, a distance of the triaxial magnetic sensor 12 to the measurement target conductor MC1 is r2, and a distance of the triaxial magnetic sensor 13 to the measurement target conductor MC1 is r3. The distance r1 is a length of a line segment perpendicularly drawn from the triaxial magnetic sensor 11 to the measurement target conductor MC1, the distance r2 is a length of a line segment perpendicularly drawn from the triaxial magnetic sensor 12 to the measurement target conductor MC1, and the distance r3 is a length of a line segment perpendicularly drawn from the triaxial magnetic sensor 13 to the measurement target conductor MC1. It should be noted that the distances r1, r2, and r3 cannot be detected.

Further, the magnetic field formed at the positions of the triaxial magnetic sensors 11, 12, and 13 by the current I flowing through the measurement target conductor MC1 is represented as $H_{Ai}$ (i=1, 2, 3). $H_{Ai}$ is a vector. That is, a magnetic field formed at the position of the triaxial magnetic sensor 11 by the current I flowing through the measurement target conductor MC1 is represented as $H_{A1}$, a magnetic field formed at the position of the triaxial magnetic sensor 12 by the current I flowing through the measurement target conductor MC1 is represented as $H_{A2}$, and a magnetic field formed at the position of the triaxial magnetic sensor 13 by the current I flowing through the measurement target conductor MC1 is represented as $H_{A3}$.

Further, when a distance of the sensor head 10 to the measurement target conductor MC2 is sufficiently larger than a distance of the sensor head 10 to the measurement target conductor MC1, a magnetic field formed due to the current I flowing through the measurement target conductor MC2 can be regarded as acting approximately uniformly on the triaxial magnetic sensors 11, 12, and 13. This magnetic field is represented as $H_B$. $H_B$ is a vector. Then, a magnetic field $H_i$ (i=1, 2, 3) formed at the positions of the triaxial magnetic sensors 11, 12, and 13 by the current I flowing through the measurement target conductors MC1 and MC2 is expressed by Equation (1) below. $H_i$ is a vector.

[Math. 1]

$$H_i = H_{Ai} + H_B \quad (1)$$

Next, in order to associate the xyz Cartesian coordinate system related only to the sensor head 10 with the XYZ Cartesian coordinate system related to the measurement target conductors MC1 and MC2, the direction of the current I (a direction of the X axis in FIG. 3) is obtained. As described above, since the magnetic field $H_B$ formed due to the current I flowing through the measurement target conductor MC2 is approximately uniform, the magnetic field $H_B$ can be canceled by taking a difference between the detection results of the triaxial magnetic sensors 11, 12, and 13. Further, since the direction of the current I is orthogonal to the direction of the magnetic field, a direction of an outer product of differences between the detection results of the triaxial magnetic sensors 11, 12, and 13 matches the direction of the current I. Therefore, a unit vector j in the direction of the current I (a direction of the X axis in FIG. 3) is expressed by Equation 2 below using the detection results (magnetic fields H1, H2, and H3) of the triaxial magnetic sensors 11, 12, and 13.

[Math. 2]

$$j = \frac{(H3 - H1) \times (H2 - H1)}{\|(H3 - H1) \times (H2 - H1)\|} \quad (2)$$

Figure 4:
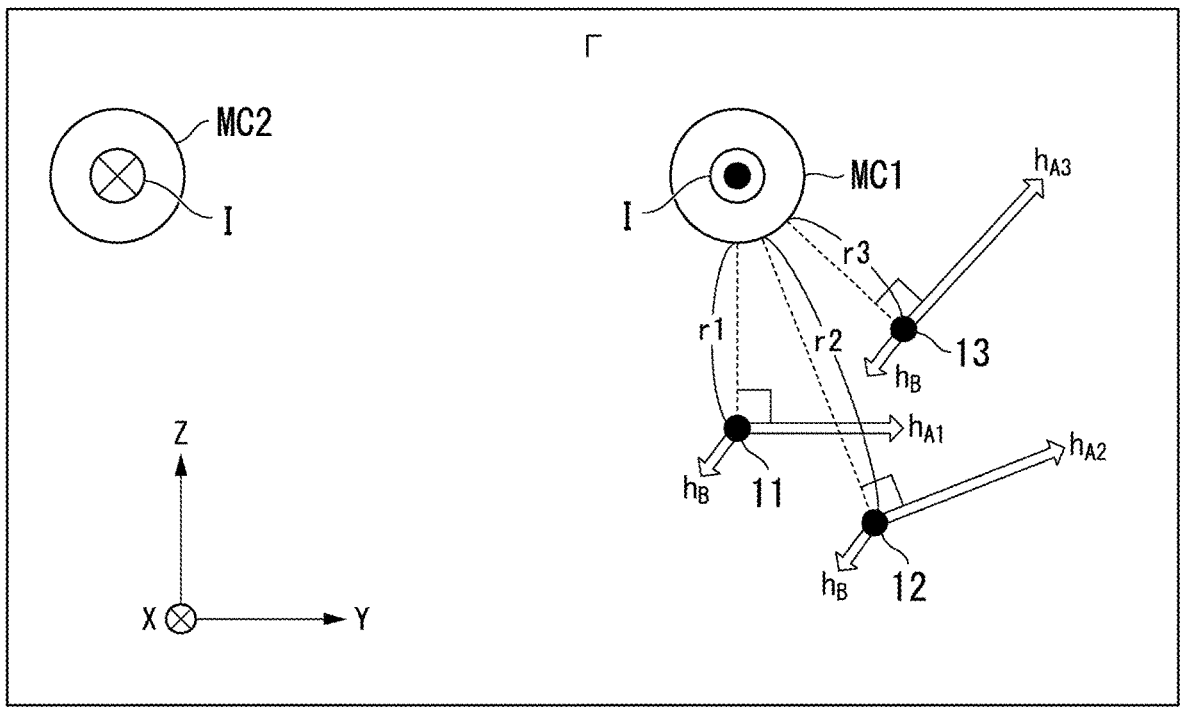
FIG. 4 is a view of a measurement target conductor and a triaxial magnetic sensor as viewed from a direction D1 in FIG. 3.

Next, a plane Γ perpendicular to the current I is considered as illustrated in FIG. 4, in order to represent various vectors represented by the xyz Cartesian coordinate system in the XYZ Cartesian coordinate system. That is, the plane Γ perpendicular to the unit vector j obtained by using Equation (2) above is considered. It can also be said that the plane Γ is a plane parallel to a YZ plane. FIG. 4 is a view of the measurement target conductor and the triaxial magnetic sensor as viewed from the direction D1 in FIG. 3. The direction D1 in FIG. 3 is a direction along the longitudinal direction of the measurement target conductors MC1 and MC2 (a direction opposite to the direction of the current I flowing through the measurement target conductor MC1, and a direction along the direction of the current I flowing through the measurement target conductor MC2). In FIG. 4, the illustration of the sensor head 10 is omitted in order to facilitate understanding, and the measurement target conductors MC1 and MC2 and the triaxial magnetic sensors 11, 12, and 13 are shown.

By projecting the measurement target conductors MC1 and MC2, the triaxial magnetic sensors 11, 12, and 13, and magnetic fields formed at the positions of the triaxial magnetic sensors 11, 12, and 13 onto the plane Γ illustrated in FIG. 4, various vectors represented by the xyz Cartesian coordinate system are represented by the XYZ Cartesian coordinate system. As illustrated in FIG. 4, a magnetic field formed at the positions of the triaxial magnetic sensors 11, 12, and 13 due to a current I flowing in an X direction (±X direction) perpendicular to a paper surface is orthogonal to an X axis. Therefore, it is possible to project the magnetic field formed at the positions of the triaxial magnetic sensors 11, 12, and 13 onto the plane Γ orthogonal to the direction in which the current I flows, without changing a magnitude of the magnetic field.

Here, the positions of the triaxial magnetic sensors 11, 12, and 13 on the plane Γ are represented as $p_i$ (i=1, 2, 3), and a position of the measurement target conductor MC1 on the plane Γ is represented as $p_A$. $p_i$ and $p_A$ are two-dimensional vectors. Further, the magnetic field hi (i=1, 2, 3) projected onto the plane Γ is expressed by Equation (3) below. $h_{Ai}$ and $h_B$ in Equation (3) below are respective projections of $H_{Ai}$ and $H_B$ in Equation (1) above onto the plane Γ. hi is a two-dimensional vector.

[Math. 3]

$$hi = h_{Ai} + h_B \quad (3)$$

Subsequently, the magnetic field $H_B$ formed due to the current I flowing through the measurement target conductor MC2 is estimated. First, as illustrated in FIG. 4, a magnetic field $h_{A1}$ is orthogonal to a line segment perpendicularly drawn from the triaxial magnetic sensor 11 to the measurement target conductor MC1 on the plane Γ. Further, a magnetic field $h_{A2}$ is orthogonal to a line segment perpendicularly drawn from the triaxial magnetic sensor 12 to the measurement target conductor MC1 on the plane Γ. Similarly, a magnetic field hA3 is orthogonal to a line segment perpendicularly drawn from the triaxial magnetic sensor 13 to the measurement target conductor MC1 on the plane Γ. Therefore, since an inner product of vectors indicating these line segments and the magnetic fields $h_{A1}$, $h_{A2}$, and $h_{A3}$ becomes zero, Equation (4) below is established.

[Math. 4]

$$(hi - h_B)^T (pi - p_A) = 0 \ (i = 1, 2, 3) \quad (4)$$

Next, when attention is paid to a relationship between a length of the line segment and a magnitude of the magnetic fields $h_{A1}$, $h_{A2}$, and $h_{A3}$, Equation (5) below is established from Ampere's law.

[Math. 5]

$$\|hi - h_B\| \cdot \|pi - p_A\| = \frac{I}{2\pi} \ (i = 1, 2, 3) \quad (5)$$

Here, the inner product of the vector indicating the line segment perpendicularly drawn from the triaxial magnetic sensors 11, 12, and 13 to the measurement target conductor MC1 and the magnetic fields $h_{A1}$, $h_{A2}$, and $h_{A3}$ becomes zero as described above, but when the vector indicating each line segment is rotated by 90° within the plane Γ and then the inner product with the magnetic fields $h_{A1}$, $h_{A2}$, and $h_{A3}$ is taken, Equation (6) below is established.

[Math. 6]

$$(hi - h_B)^T R(pi - p_A) = \frac{I}{2\pi} \ (i = 1, 2, 3) \quad (6)$$

Here, R in Equation (6) above is a 90° rotation matrix within a two-dimensional coordinate plane and is expressed by Equation (7) below.

[Math. 7]

$$R = \begin{pmatrix} 0 & -1 \\ 1 & 0 \end{pmatrix} \quad (7)$$

The magnetic field ha projected onto the plane Γ can be obtained from Equations (8) below obtained by using Equations (4) and (6) above.

[Math. 8]

$$h_B = (R^T h^{-1} p R^T - h^{-1} p)^{-1} (R^T h^{-1} c_c - h^{-1} c_1) \quad (8)$$

Here, p, h, $c_1$, and $c_2$ in Equation (8) above are as shown in Equation (9) below.

[Math. 9]

$$p = \begin{pmatrix} p2^T - p1^T \\ p3^T - p1^T \end{pmatrix}, h = \begin{pmatrix} h2^T - h1^T \\ h3^T - h1^T \end{pmatrix},$$

$$c_1 = \begin{pmatrix} h2^T p2 - h1^T p1 \\ h3^T p3 - h1^T p1 \end{pmatrix}, c_2 = \begin{pmatrix} h2^T Rp2 - h1^T Rp1 \\ h3^T Rp3 - h1^T Rp1 \end{pmatrix} \quad (9)$$

Here, an X component (a component in a direction in which the current I flows) is lost in the magnetic field $h_B$ obtained by projecting the magnetic field $H_B$ formed due to the current I flowing through the measurement target conductor MC2 onto the plane Γ. Since an X component of the magnetic field $H_{Ai}$ formed due to the current I flowing through the measurement target conductor MC1 is not generated, the X component of the magnetic field Hi formed due to the current I flowing through the measurement target conductors MC1 and MC2 is equivalent to the X component of the magnetic field $H_B$. Therefore, it is possible to obtain the magnetic field $H_B$ by adding the X component ($j^T Hi$) of the magnetic field Hi to the magnetic field $h_B$. Thus, it is possible to estimate the magnetic field $H_B$ formed due to the current I flowing through the measurement target conductor MC2.

Subsequently, the position $p_A$ of the measurement target conductor MC1 on the plane Γ is obtained. The position $p_A$ of the measurement target conductor MC1 is obtained from Equation (10) below obtained by using Equations (4), (6) and (8) above.

[Math. 10]

$$p_A = -h^{-1} p h_B + h^{-1} c_1 \quad (10)$$

When the position $p_A$ of the measurement target conductor MC1 on the plane Γ is known, it is possible to obtain (estimate) the distances r1, r2, and r3 of the triaxial magnetic sensors 11, 12, and 13 with respect to the measurement target conductor MC1. Thus, the distance estimator 25c obtains (estimates) the distances r1, r2, and r3 of the triaxial magnetic sensors 11, 12, and 13 with respect to the measurement target conductor MC1.

When the distances r1, r2, and r3 can be obtained (estimated), it is possible to measure the current I from Ampere's law using any one of the following combinations.

Combination of the distance r1 with the detection result (magnetic field H1) of the triaxial magnetic sensor 11

Combination of the distance r2 with the detection result (magnetic field H2) of the triaxial magnetic sensor 12

Combination of the distance r3 with the detection result (magnetic field H3) of the triaxial magnetic sensor 13

Specifically, first, the magnetic field HB estimated by using Equation (8) above or the like is subtracted from the detection results (the magnetic field Hi) of the triaxial magnetic sensors 11, 12, and 13, and the magnetic field HA formed at the positions of the triaxial magnetic sensors 11, 12, and 13 by the current I flowing through the measurement target conductor MC1 is obtained. The distances r1, r2, and r3 of the triaxial magnetic sensors 11, 12, and 13 with respect to the measurement target conductor MC1 are obtained by using Equation (9) above or the like. Therefore, the current I flowing through the measurement target conductor MC1 can be obtained by using Equation (11) below.

[Math. 11]

$$I = 2\pi r_i \|H_{Ai}\| \tag{11}$$

<Operation of Current Measurement Device>

Next, an operation when the current I flowing through the measurement target conductor MC1 (outward path) is measured by using the current measurement device 1 will be described. First, a user of the current measurement device 1 disposes the sensor head 10 close to the measurement target conductor MC1 in order to measure the current I flowing through the measurement target conductor MC1. The position and posture of the sensor head 10 with respect to the measurement target conductor MC1 is arbitrary.

Here, it is necessary to dispose the sensor head 10 close to the measurement target conductor MC1 so that the distance of the sensor head 10 to the measurement target conductor MC2 can be regarded as being sufficiently larger than the distance of the sensor head 10 to the measurement target conductor MC1. When the measurement target conductor MC2 is movable, the measurement target conductor MC2 is disposed far away from the measurement target conductor MC1 so that the distance of the sensor head 10 to the measurement target conductor MC2 can be regarded as being sufficiently larger than the distance of the sensor head 10 to the measurement target conductor MC1.

Figure 5:
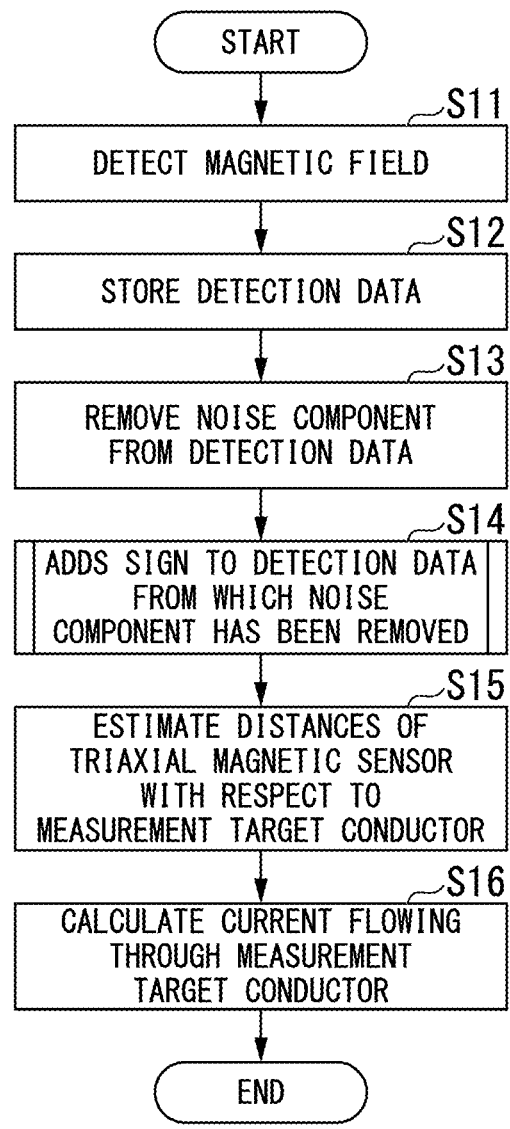
FIG. 5 is a flowchart illustrating an overview of an operation of the current measurement device according to the first embodiment of the present invention.
Figure 6:
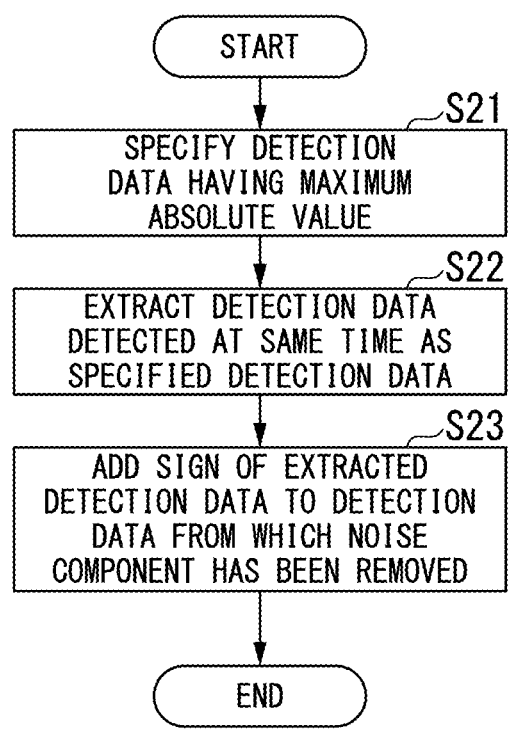
FIG. 6 is a flowchart illustrating details of processing of step S14 in FIG. 5.

FIG. 5 is a flowchart illustrating an overview of an operation of the current measurement device according to the first embodiment of the present invention. FIG. 6 is a flowchart illustrating details of a process of step S14 in FIG. 5. The flowchart illustrated in FIG. 5 is started, for example, at a fixed cycle (for example, about 1 to several seconds). When processing of the flowchart illustrated in FIG. 5 is started, the triaxial magnetic sensors 11, 12, and 13 first detect the magnetic field formed due to the current I flowing through the measurement target conductors MC1 and MC2 (step S11). The detection of the magnetic field by the triaxial magnetic sensors 11, 12, and 13 is performed, for example, about 1000 times per second.

Then, the calculator 25 of the circuit 20 stores detection data indicating the detection results of the triaxial magnetic sensors 11, 12, and 13 in the memory 23 (step S12). Specifically, the calculator 25 stores time information indicating a detection time, information indicating sensor numbers of the triaxial magnetic sensors 11, 12, and 13, and information indicating an identification of the axes (the first axis, the second axis, and the third axis), in addition to the detection data of the triaxial magnetic sensors 11, 12, and 13 in the memory 23. By this processing being performed, for example, detection data (9000 pieces of detection data) for 1000 times in the respective axes of the triaxial magnetic sensors 11, 12, and 13 are stored in the memory 23.

FIG. 7 is a diagram illustrating processing that is performed in the first embodiment of the present invention. As illustrated in FIG. 7, detection data for 1000 times from time t0 to time t999 (not illustrated) is stored in the memory 23. For example, the detection data of the respective axes (the first axis, the second axis, and the third axis) of the triaxial magnetic sensors 11, 12, and 13 at time t0 is as follows.

Triaxial magnetic sensor 11: "+Da10", "+Da20", "+Da30"
Triaxial magnetic sensor 12: "+Db10", "−Db20", "−Db30"
Triaxial magnetic sensor 13: "−Dc10", "−Dc20", "−Dc30"

In FIG. 7, in order to facilitate understanding, a value (for example, "Da10") of the detection data is set as an absolute value, and a sign of the detection data is clearly indicated. Signs of the respective axes of the triaxial magnetic sensors 11, 12, and 13 are determined by the positional relationship among the triaxial magnetic sensors 11, 12, and 13 with respect to the measurement target conductors MC1 and MC2. Here, it is assumed that the sensor head 10 does not move (the position or posture of the sensor head 10 with respect to the measurement target conductor MC1 does not change) during the measurement of the current flowing through the measurement target conductor MC1.

Here, in the example illustrated in FIG. 7, it can be seen that the signs are inverted from a comparison between the detection data obtained at times t0 to t4 and the detection data obtained at times t5 to t9. This is because a direction of the current flowing through the measurement target conductor MC1 changes between time t4 and time t5. Further, it can be seen that a relationship between the signs of the respective axes of the triaxial magnetic sensors 11, 12, and 13 is the same when the current directions are the same, and is inverted when the current directions change.

For example, a relationship between the signs of the respective axes of the triaxial magnetic sensors 11, 12, and 13 obtained at times t0 to t4, and a relationship between the signs of the respective axes of the triaxial magnetic sensors 11, 12, and 13 obtained at times t5 to t9 are as follows. Since the sensor head 10 does not move during current measurement, there are only the following two relationships between the signs of the respective axes of the triaxial magnetic sensors 11, 12, and 13 with respect to the detection data for 1000 times from time t0 to time t999 (not illustrated). Since the following two relationships are caused due to the inversion of the direction of the current, the distance estimation yields the same result even though which of the two relationships is selected.

Time t0 to t4: "+" "+" "+", "+" "−" "−", "−" "−" "−"
Time t5 to t9: "−" "−" "−", "−" "+" "+", "+" "+" "+"

Then, the noise remover 25a removes the noise component from the detection data (step S13). Specifically, the noise remover 25a reads the detection data stored in the memory 23, and performs the averaging processing or square root of sum of squares processing on the read detection data to remove the noise component included in the detection data. Here, three types of detection data indicating the detection results of the three axes are output from the triaxial magnetic sensors 11, 12, and 13. The removal of the noise components by the noise remover 25a is individually performed on the detection data of the respective axis.

As illustrated in FIG. 7, the detection data of the respective axes (the first axis, the second axis, and the third axis) of the triaxial magnetic sensor 11 from which the noise component has been removed are noise-removed detection data "D11", "D12", and "D13". Further, the detection data of each axis of the triaxial magnetic sensor 12 from which the noise component has been removed are noise-removed detection data "D21", "D22", and "D23". Similarly, the detection data of each axis of the triaxial magnetic sensor 13 from which the noise component has been removed are noise-removed detection data "D31", "D32", and "D33".

Subsequently, the sign adder 25b adds a sign to the detection result from which the noise component has been removed by the noise remover 25a (step S14). When the process of step S14 is started, first, the sign adder 25b specifies the detection data having a maximum absolute value among the detection data stored in the memory 23, as illustrated in FIG. 6 (step S21).

For example, the sign adder 25b takes absolute values of the detection data read from the memory 23, arranges the absolute values in ascending or descending order, and specifies the last value of the absolute values arranged in ascending order or a first value of the absolute values arranged in descending order. Here, it is assumed that the detection data "+Db12" of the first axis of the triaxial magnetic sensor 12 obtained at time t2 is specified.

Next, the sign adder 25b extracts the detection data detected at the same time as the specified detection data (step S22). In the example illustrated in FIG. 7, the detection data "+Da12", "+Da22", and "+Da32" of the respective axes of the triaxial magnetic sensor 11 and the detection data "+Db12", "−Db22", and "−Db32" of the respective axes of the triaxial magnetic sensor 12, and the detection data "−Dc12", "−Dc22", and "−Dc32" of the respective axes of the triaxial magnetic sensor 13 obtained at time t2 are extracted.

The sign adder 25b adds the sign of the detection data extracted in the process of step S22 to the detection data from which the noise component has been removed in the process of step S13 (step S23). Specifically, the sign adder 25b adds the extracted signs of the detection data "+Da12", "+Da22", and "+Da32" of the respective axes of the triaxial magnetic sensor 11 to the noise-removed detection data "D11", "D12", and "D13" illustrated in FIG. 7.

Further, the sign adder 25b adds the extracted signs of the detection data "+Db12", "−Db22", and "−Db32" of the respective axes of the triaxial magnetic sensor 12 to the noise-removed detection data "D21", "D22", and "D23" illustrated in FIG. 7. Similarly, the sign adder 25b adds the extracted signs of the detection data "−Dc12", "−Dc22", and "−Dc32" of the respective axes of the triaxial magnetic sensor 13 to the noise-removed detection data "D31", "D32", and "D33" illustrated in FIG. 7.

By performing the above processing, it is possible to obtain sign-added detection data obtained by adding the extracted sign of the detection data to the noise-removed detection data that is the detection result from which the noise component has been removed. Specifically, the sign-added detection data "+D11", "+D12", "+D13", "+D21", "−D22", "−D23", "−D31", "−D32", and "−D33" can be obtained, as illustrated in FIG. 7.

Subsequently, the distance estimator 25c estimates the distances r1, r2, and r3 of the triaxial magnetic sensors 11, 12, and 13 with respect to the measurement target conductor MC1 (step S15). Specifically, first, the distance estimator 25c performs calculation shown in Equation (10) described above by using the positions pi of the triaxial magnetic sensors 11, 12, and 13 on the plane Γ illustrated in FIG. 4, the magnetic field hi projected onto the plane Γ, and the magnetic field $h_B$ calculated using Equations (8) and (9) described above, to obtain the position $p_A$ of the measurement target conductor MC1 on the plane Γ. The distance estimator 25c estimates the distances r1, r2, and r3 of the triaxial magnetic sensors 11, 12, and 13 with respect to the measurement target conductor MC1 from the position $p_A$ of the measurement target conductor MC1 on the plane Γ and the positions pi of the triaxial magnetic sensors 11, 12, and 13 on the plane Γ.

Here, the sign-added detection data of each axis of the triaxial magnetic sensor 11 indicates the magnetic field H1 formed at the position of the triaxial magnetic sensor 11. Further, the sign-added detection data of each axis of the triaxial magnetic sensor 12 indicates the magnetic field H2 formed at the position of the triaxial magnetic sensor 12. Further, the sign-added detection data of each axis of the triaxial magnetic sensor 13 indicates the magnetic field H3 formed at the position of the triaxial magnetic sensor 13. The magnetic field hi is obtained by projecting the magnetic field Hi (magnetic fields H1, H2, and H3) indicated by these pieces of sign-added detection data onto the plane Γ.

When the above processing ends, the current calculator 25d of the calculator 25 calculates the current I flowing through the measurement target conductor MC1 (outward path) (step S16). Specifically, the current calculator 25d of the calculator 25 performs calculation shown in Equation (11) described above by using the detection results (magnetic fields H1, H2, and H3) of the triaxial magnetic sensors 11, 12, and 13, the estimated magnetic field $H_B$, and the distances r1, r2, and r3 estimated in step S15, to calculate the current I flowing through the measurement target conductor MC1. It is possible to estimate the magnetic field $H_B$ by calculating the magnetic field $h_B$ using Equations (8) and (9) above and adding the X component ($j^T$Hi) of the magnetic field Hi to the magnetic field $h_B$.

More specifically, the current calculator 25d subtracts the estimated magnetic field $H_B$ from the detection results (magnetic fields H1, H2, and H3) of the triaxial magnetic sensors 11, 12, and 13 to obtain the magnetic field $H_{Ai}$ in Equation (11) (the magnetic field formed at the positions of the triaxial magnetic sensors 11, 12, and 13 by the current I flowing through the measurement target conductor MC1). The current calculator 25d performs the calculation shown in Equation (11) by using the distances r1, r2, and r3 estimated in step S15 and the magnitude of the magnetic field $H_{Ai}$. Thus, an influence of the magnetic field formed due to the current I flowing through the measurement target conductor MC2 is eliminated and then the current I flowing through the measurement target conductor MC1 is measured in a non-contact manner.

As described above, in the present embodiment, the sign is added to the detection data from which the noise component has been removed (the noise-removed detection data) on the basis of the sign information of each of the detection data of the triaxial magnetic sensors 11, 12, and 13 obtained at the specific point in time (time t2), and the current I flowing through the measurement target conductor MC1 is measured by using the detection data to which the sign has been added (sign-added detection data). Accordingly, it is possible to accurately measure the current flowing through the measurement target conductor in a non-contact manner regardless of a direct current or alternating current.

Further, in the present embodiment, the sensor head 10 provided with the triaxial magnetic sensors 11, 12, and 13 and the circuit 20 provided with the calculator 25 are separated and connected by the cable CB. Accordingly, the handling of the sensor head 10 is facilitated, and for example, the sensor head 10 can be easily installed in a small place, making more flexible disposition possible.

When the current I flowing through the measurement target conductor MC1 is measured, it is not always necessary to use all of the detection results of the triaxial magnetic sensors 11, 12, and 13 (an influence of the magnetic field $H_B$ is eliminated from the magnetic fields H1, H2, and H3) and the estimated distances r1, r2, and r3. It is possible to measure the current I flowing through the measurement target conductor MC1 by using any one of the following combinations.

Combination of the distance r1 with the detection result of the triaxial magnetic sensor 11

Combination of the distance r2 with the detection result of the triaxial magnetic sensor 12

Combination of the distance r3 with the detection result of the triaxial magnetic sensor 13

Second Embodiment

<Configuration of Current Measurement Device>

Figure 8:
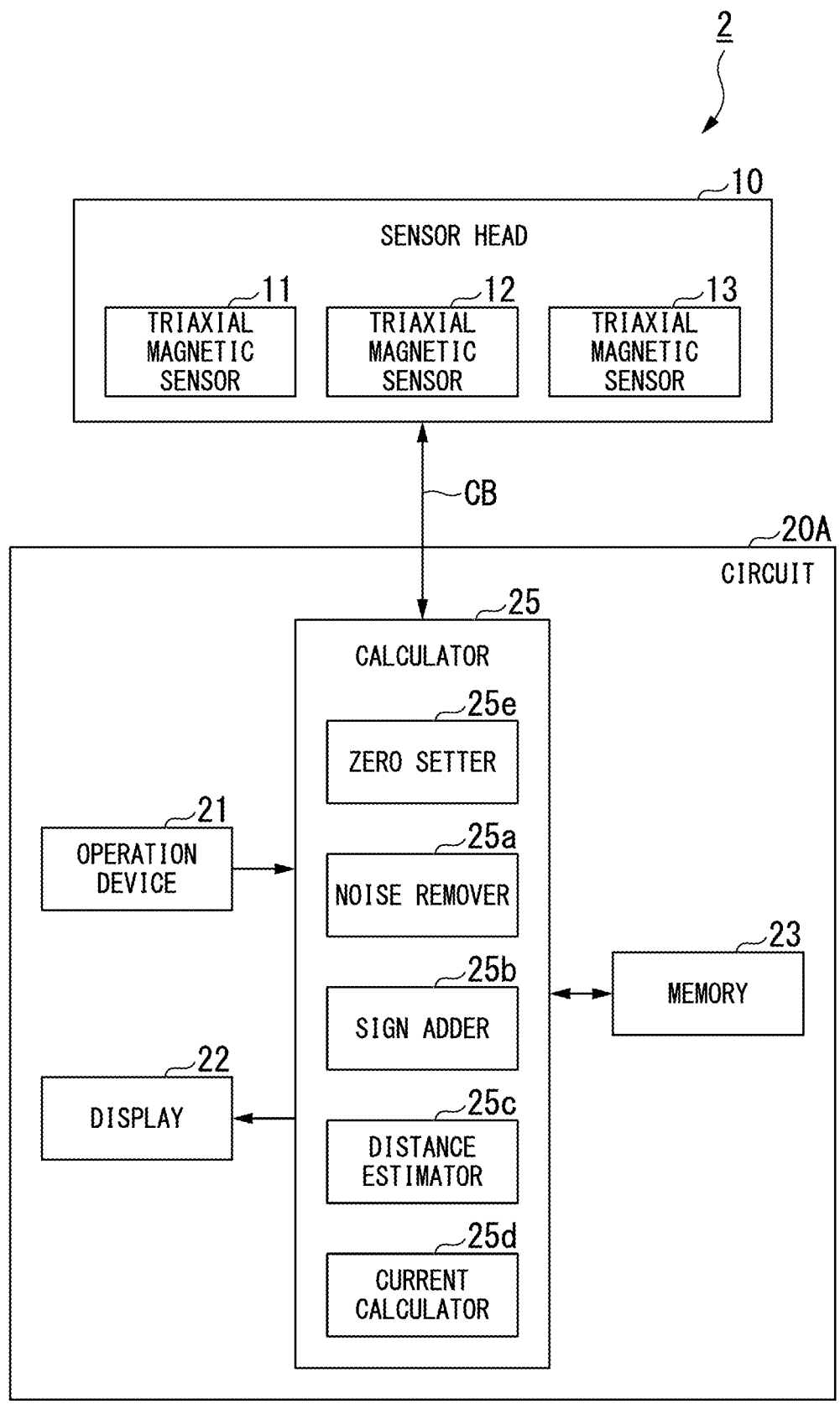
FIG. 8 is a block diagram illustrating a main configuration of a current measurement device according to a second embodiment of the present invention.

FIG. 8 is a block diagram illustrating a main configuration of a current measurement device according to a second embodiment of the present invention. In FIG. 8, blocks corresponding to those in the configuration illustrated in FIG. 2 are denoted by the same reference signs. As illustrated in FIG. 8, the current measurement device 2 according to the present embodiment has a configuration in which a circuit 20A is provided in place of the circuit 20 of the current measurement device 1 illustrated in FIG. 2. The circuit 20A is a circuit in which a zero setter 25e is added to the calculator 25.

The zero setter 25e performs processing of setting the value to zero on the detection result whose value is equal to or smaller than a preset noise threshold value (threshold value) among the detection results of the triaxial magnetic sensors 11, 12, and 13. The detection results of the triaxial magnetic sensors 11, 12, and 13 are stored in the memory 23 by the calculator 25 after the processing is performed by the zero setter 25e. Such a zero setter 25e is provided to improve the measurement accuracy for the current I.

Figure 9:
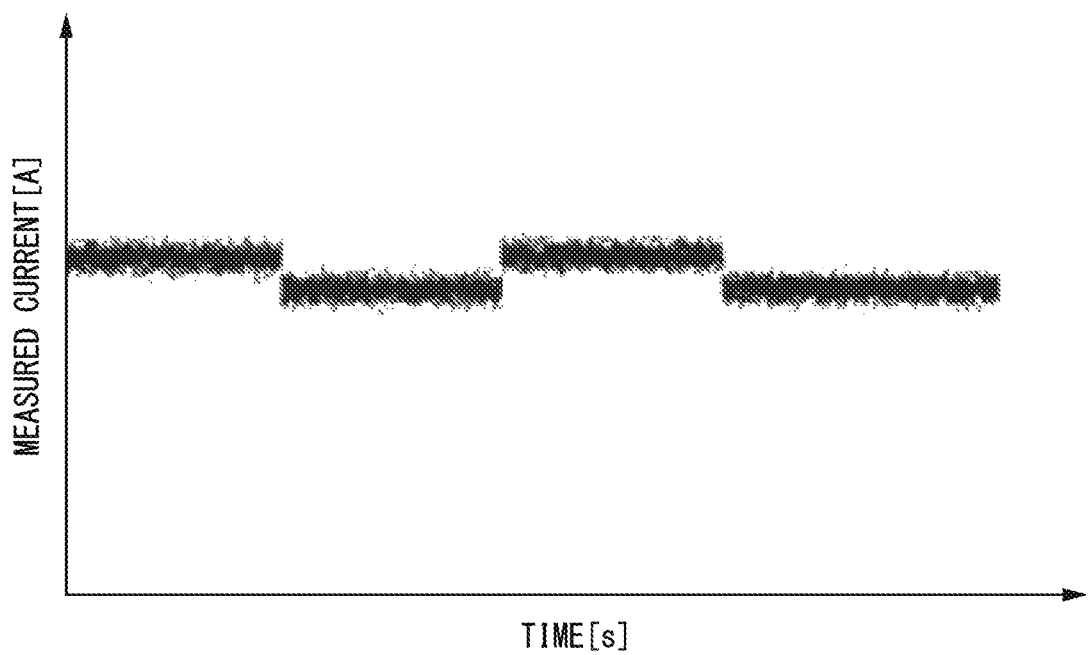
FIG. 9 is a diagram illustrating an example of discontinuity of current measurement values to be solved in the second embodiment of the present invention.

Specifically, the sign of the detection result whose value (absolute value) is small among the detection results of the triaxial magnetic sensors 11, 12, and 13 may change randomly due to an influence of the noise component. When such a change in sign (a random change) occurs, a measured value of the current I also changes randomly, and as illustrated in FIG. 9, the measured value of the current I becomes discontinuous and the measurement accuracy deteriorates. FIG. 9 is a diagram illustrating an example of discontinuity of current measurement values to be solved in the second embodiment of the present invention. The zero setter 25e is provided in order to prevent such a decrease in measurement accuracy. The noise threshold value set in the zero setter 25e is set in consideration of the noise component having an influence on the detection results of the triaxial magnetic sensors 11, 12, and 13, required measurement accuracy, and the like.

<Operation of Current Measurement Device>

Figure 10:
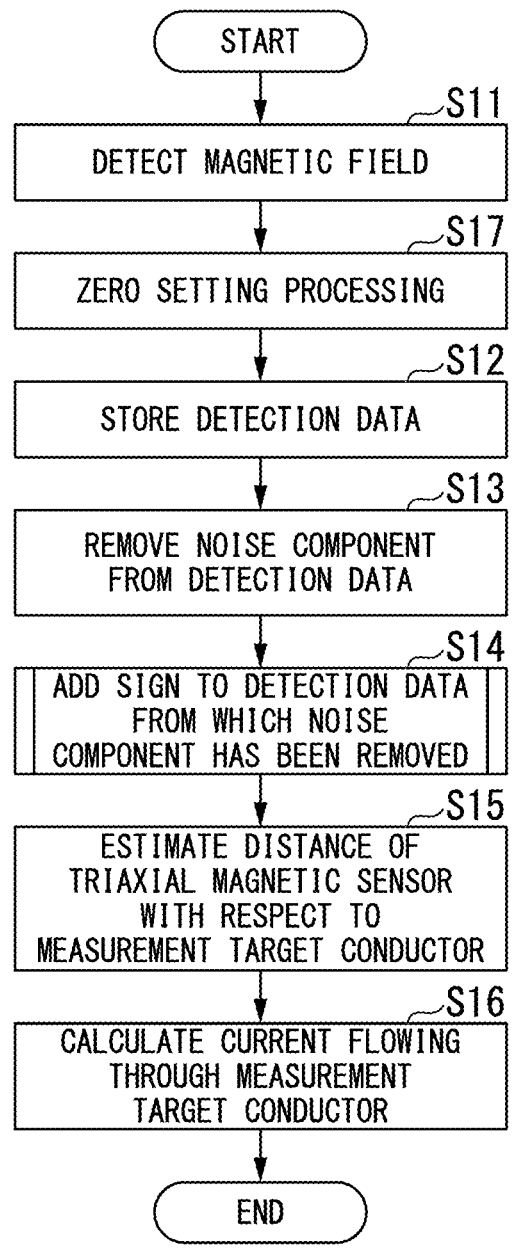
FIG. 10 is a flowchart illustrating an overview of an operation of the current measurement device according to the second embodiment of the present invention.

FIG. 10 is a flowchart illustrating an overview of the operation of the current measurement device according to the second embodiment of the present invention. In the flowchart illustrated in FIG. 10, step S17 is added between steps S11 and S12 of the flowchart illustrated in FIG. 5. When processing of the flowchart illustrated in FIG. 10 is started, the triaxial magnetic sensors 11, 12, and 13 first detect the magnetic field formed due to the current I flowing through the measurement target conductors MC1 and MC2 (step S11).

Then, the zero setter 25e performs zero setting processing on the detection data indicating the detection results of the triaxial magnetic sensors 11, 12, and 13 (step S17). Specifically, the zero setter 25e performs processing of comparing the value (absolute value) of the detection result of the triaxial magnetic sensors 11, 12, and 13 with the preset noise threshold value, and setting the value of the detection result whose value is equal to or smaller than the noise threshold value to zero. The zero setting processing in the zero setter 25e is performed individually on the detection data of each axis.

Subsequently, the calculator 25 of the circuit 20 stores the detection data on which the zero setting processing has been performed in the memory 23 (step S12). Since the processing after step S12 in FIG. 10 is the same processing as the processing after step S12 illustrated in FIG. 5, detailed description thereof will be omitted.

As described above, in the present embodiment, the zero setter 25e performs the zero setting processing on the detection data indicating the detection results of the triaxial magnetic sensors 11, 12, and 13, and sets the value of the detection result whose value (absolute value) is equal to or smaller than the preset noise threshold value to zero. Accordingly, the sign of the detection data does not change randomly, and it is possible to prevent the measured value of the current I from becoming discontinuous, thereby increasing the measurement accuracy for the current I.

Further, also in the present embodiment, the sign is added to the detection data from which the noise component has been removed (the noise-removed detection data), and the current I flowing through the measurement target conductor MC1 is measured by using the detection data to which the sign has been added (sign-added detection data). Accordingly, it is possible to accurately measure the current flowing through the measurement target conductor in a non-contact manner regardless of a direct current or alternating current.

Although the current measurement device according to the embodiment of the present invention has been described above, the present invention is not limited to the above embodiment and can be freely changed within the scope of the present invention. For example, in the above-described embodiment, an example in which the sensor head 10 is provided with three triaxial magnetic sensors 11, 12, and 13 has been described. However, the number of the triaxial magnetic sensors provided in the sensor head 10 may be two or may be four or more.

Further, in the above-described embodiment, the example in which the estimation of the distances of the triaxial magnetic sensors 11, 12, and 13 with respect to the measurement target conductor MC1, and the measurement of the current I flowing through the measurement target conductor MC1 are performed using the detection results of the triaxial magnetic sensors 11, 12, and 13 has been described. However, a configuration in which a dedicated magnetic sensor for current measurement whose relative positional relationship with respect to the triaxial magnetic sensors 11, 12, and 13 is known is included, in addition to the triaxial magnetic sensors 11, 12, and 13, may be adopted.

In the case of this configuration, for example, the distances of the triaxial magnetic sensors 11, 12, and 13 with respect to the measurement target conductor MC1 are estimated using the detection result of the triaxial magnetic sensor, and a distance of the magnetic sensor for current measurement with respect to the measurement target conductor MC1 is estimated. Measurement of the current I flowing through the measurement target conductor MC1 may be performed by using the estimated distance (the distance of the magnetic sensor for current measurement with respect to the measurement target conductor MC1) and the detection result of the magnetic sensor for current measurement.

Further, although, in the above-described embodiment, the case in which the detections of the magnetic fields by the triaxial magnetic sensors 11, 12, and 13 are performed at the same time (at the same timing) has been described by way of example, the detections may be performed at different timings. When the detections of the magnetic fields are performed at different timings, number information indicating a detection order may be added to the detection data instead of the time information indicating the detection time, and the resultant detection data is stored in the memory 23. In this case, when the measurement target is an alternating current, it is preferable that, after the number of stored pieces of data is made sufficiently large (at least equal to or larger than half the cycle of the alternating current that is a measurement target), the number information indicating the detection order is added to the detection data, and the resultant detection data is stored in the memory 23.

Further, an example in which the sign adder 25b sets the point in time at which the detection result whose absolute value is maximized among the detection results of the triaxial magnetic sensors 11, 12, and 13 stored in the memory 23 is obtained to the specific point in time has been described in the above embodiment. However, for example, a threshold value according to a magnitude of the noise component may be set, and any point in time at which the detection result whose absolute value is larger than the threshold value among the detection results of the triaxial magnetic sensors 11, 12, and 13 stored in the memory 23 is obtained may be a specific point in time. The threshold value according to the magnitude of the noise component may be set to, for example, a value exceeding the magnitude (an amplitude or effective value) of the noise component superimposed on the detection data output from the triaxial magnetic sensors 11, 12, and 13 in a state in which there is no influence of the magnetic field formed due to the current.

Further, a case in which the noise threshold value set in the zero setter 25e is set in consideration of the noise component having an influence on the detection results of the triaxial magnetic sensors 11, 12, and 13, required measurement accuracy, and the like has been described in the second embodiment described above. However, the noise threshold value may be set according to the same guideline as that for the threshold value set by the sign adder 25b. That is, the noise threshold value may be set to, for example, the value exceeding the magnitude (amplitude or effective value) of the noise component superimposed on the detection data output from the triaxial magnetic sensors 11, 12, and 13 in a state in which there is no influence of the magnetic field formed due to the current.

Further, in the above-described embodiment, the example in which the triaxial magnetic sensors 11 and 12 are separated by a distance d [m] in the first axis direction (x axis direction), and the triaxial magnetic sensors 11 and 13 are separated by the distance d [m] in the third axis direction (z axis direction) has been described. However, the triaxial magnetic sensors 11, 12, and 13 may be disposed so that the magnetic sensing direction and the relative position have a prescribed relationship.

Various types of processing of the present embodiment described above may be performed by recording a program for realizing some or all of functions of the circuits 20 and 20A described in the present embodiment in a computer-readable storage medium, loading the program recorded on the storage medium to a computer system, and executing the program. The "computer system" referred to herein may include an OS or hardware such as a peripheral device. Further, the "computer system" also includes a homepage providing environment (or a display environment) when a WWW system is used. Further, the "computer-readable storage medium" refers to a flexible disk, a magneto-optical disc, a ROM, or a writable nonvolatile memory such as a flash memory, a portable medium such as a CD-ROM, or a storage device such as a hard disk built into the computer system.

Further, the "computer-readable storage medium" includes a storage medium that holds a program for a certain time, such as a volatile memory (dynamic random access memory (DRAM)) inside a computer system including a server and a client when a program is transmitted via a network such as the Internet or a communication line such as a telephone line. Further, the above program may be transferred from a computer system in which the program is stored in a storage device or the like to other computer systems via a transmission medium or by transmission waves in the transmission medium. Here, the "transmission medium" for transferring the program refers to a medium having a function of transferring information, such as a network (communication network) such as the Internet or a communication line such as a telephone line. Further, the above program may be a program for realizing some of the above-described functions. Further, the program may be a program capable of realizing the above-described functions in combination with a program previously recorded on a computer system, that is, a differential file (a differential program).

The terms indicating directions such as "front, back, top, bottom, right, left, vertical, horizontal, row, and column" in the present specification refer to these directions in the device of the present invention. Accordingly, these terms in the specification of the present invention should be construed relatively in the device of the present invention.

The term "configured" is configured to execute the functions of the present invention or is used to indicate a configuration, elements, and parts of a device.

Further, the terms represented as "means-plus-function" in the claims should include any structure that can be used to execute the functions included in the present invention.

The term "unit" is used to indicate a component, unit, hardware, or a part of software programmed to execute a desired function. Typical examples of the hardware are devices or circuits, but the present invention is not limited thereto.

Although preferable examples of the present invention have been described above, the present invention is not limited to these examples. Addition, omission, replacement, and other changes of the configuration can be performed without departing from the spirit of the present invention. The present invention is not limited by the above description, but is limited only by the scope of the appended claims.

REFERENCE SIGNS LIST 1, 2 Current measurement device
10 Sensor head
11 Triaxial magnetic sensor
12 Triaxial magnetic sensor
13 Triaxial magnetic sensor
20 Circuit
23 Memory
25a Noise remover
25b Sign adder
25c Distance estimator
25d Current calculator
25e Zero setter
I Current
MC1 Measurement target conductor
MC2 Measurement target conductor

The invention claimed is:

1. A current measurement device for measuring a current flowing through measurement target conductors, the current measurement device comprising:
a plurality of triaxial magnetic sensors disposed so that a magnetic sensing direction and a relative position have a prescribed relationship;
a noise remover configured to remove noise components included in detection results of the plurality of triaxial magnetic sensors;
a sign adder configured to add a sign to the detection results from which the noise components have been removed, based on sign information of each of the detection results of the plurality of triaxial magnetic sensors obtained at a specific point in time; and
a current calculator configured to calculate a current flowing through the measurement target conductors by using the detection results to which the sign has been added by the sign adder.

2. The current measurement device according to claim 1, further comprising:
a storage configured to store the detection results of the plurality of triaxial magnetic sensors in a prescribed period,
wherein the sign adder adds the sign to the detection results from which the noise components have been removed based on the sign information of each of the detection results of the plurality of triaxial magnetic sensors at a point in time when a detection result whose an absolute value is maximized has been obtained among the detection results stored in the storage.

3. The current measurement device according to claim 1, further comprising:
a zero setter configured to set a value of a detection result whose value is equal to or smaller than a preset threshold value among the detection results of the plurality of triaxial magnetic sensors to zero.

4. The current measurement device according to claim 1, wherein the noise remover individually performs averaging processing or square root of sum of squares processing on the detection results of respective axes of the plurality of triaxial magnetic sensors obtained at prescribed fixed periods to remove the noise components included in the detection results of the plurality of triaxial magnetic sensors.

5. The current measurement device according to claim 1, further comprising:
a distance estimator configured to estimate a distance between a prescribed reference position of the current measurement device and the measurement target conductors using the detection results to which the sign has been added by the sign adder; and
a current calculator configured to calculate the current flowing through the measurement target conductors using the distance estimated by the distance estimator.

6. The current measurement device according to claim 1, further comprising:
a sensor head comprising the plurality of triaxial magnetic sensors; and
a circuit comprising at least the noise remover, the sign adder, and the current calculator.

7. The current measurement device according to claim 6, further comprising:
wherein the sensor head comprises a first triaxial magnetic sensor, a second triaxial magnetic sensor, and a third triaxial magnetic sensor,
wherein the first triaxial magnetic sensor, the second triaxial magnetic sensor, and the third triaxial magnetic sensor are magnetic sensors having magnetic sensing directions on three axes orthogonal to each other, and
wherein the first triaxial magnetic sensor, the second triaxial magnetic sensor, and the third triaxial magnetic sensor are disposed so that a magnetic sensing direction and a relative position have a prescribed relationship.

8. A current measurement method that is executed by a current measurement device comprising a plurality of triaxial magnetic sensors disposed so that a magnetic sensing direction and a relative position have a prescribed relationship, a noise remover, a sign adder, and a current calculator to measure a current flowing through measurement target conductors, the current measurement method comprising:
removing, by the noise remover, noise components included in detection results of the plurality of triaxial magnetic sensors;
adding, by the sign adder, a sign to the detection results from which the noise components have been removed, based on sign information of each of the detection results of the plurality of triaxial magnetic sensors obtained at a specific point in time; and
calculating, by the current calculator, a current flowing through the measurement target conductors by using the detection results to which the sign has been added by the sign adder.

9. The current measurement method according to claim 8, wherein the current measurement device further comprises a storage, and
wherein the current measurement method further comprises:
storing, by the storage, the detection results of the plurality of triaxial magnetic sensors in a prescribed period; and
adding, by the sign adder, the sign to the detection results from which the noise components have been removed based on the sign information of each of the detection results of the plurality of triaxial magnetic sensors at a point in time when a detection result whose an absolute value is maximized has been obtained among the detection results stored in the storage.

10. The current measurement method according to claim 8,
wherein the current measurement device further comprises a zero setter, and
wherein the current measurement method further comprises:
setting, by the zero setter, a value of a detection result whose value is equal to or smaller than a preset threshold value among the detection results of the plurality of triaxial magnetic sensors to zero.

11. The current measurement method according to claim 8, further comprising:
individually performing, by the noise remover, averaging processing or square root of sum of squares processing on the detection results of respective axes of the plurality of triaxial magnetic sensors obtained at prescribed fixed periods to remove the noise components included in the detection results of the plurality of triaxial magnetic sensors.

12. The current measurement method according to claim 8,
wherein the current calculator comprises a distance estimator and a current calculator, and wherein the current measurement method further comprises:
  estimating, by the distance estimator, a distance between a prescribed reference position of the current measurement device and the measurement target conductor using the detection results to which the sign has been added by the sign adder; and
  calculating, by the current calculator, the current flowing through the measurement target conductor using the distance estimated by the distance estimator.

13. The current measurement method according to claim 8,
wherein the current measurement device further comprises:
  a sensor head comprising the plurality of triaxial magnetic sensors; and
  a circuit comprising at least the noise remover, the sign adder, and the current calculator.

14. The current measurement method according to claim 13,
wherein the sensor head comprises a first triaxial magnetic sensor, a second triaxial magnetic sensor, and a third triaxial magnetic sensor,
wherein the first triaxial magnetic sensor, the second triaxial magnetic sensor, and the third triaxial magnetic sensor are magnetic sensors having magnetic sensing directions on three axes orthogonal to each other, and
wherein the first triaxial magnetic sensor, the second triaxial magnetic sensor, and the third triaxial magnetic sensor are disposed so that a magnetic sensing direction and a relative position have a prescribed relationship.

15. A non-transitory computer readable storage medium storing one or more programs executed by a current measurement device comprising a plurality of triaxial magnetic sensors disposed so that a magnetic sensing direction and a relative position have a prescribed relationship, a noise remover, a sign adder, and a current calculator to measure a current flowing through measurement target conductors, the one or more programs instructing the current measurement device to:
  remove, by the noise remover, noise components included in detection results of the plurality of triaxial magnetic sensors;
  add, by the sign adder, a sign to the detection results from which the noise components have been removed, based on sign information of each of the detection results of the plurality of triaxial magnetic sensors obtained at a specific point in time; and
  calculate, by the current calculator, a current flowing through the measurement target conductors by using the detection results to which the sign has been added by the sign adder.

16. The non-transitory computer readable storage medium according to claim 15,
wherein the current measurement device further comprises a storage, and
wherein the one or more programs further instructs the current measurement device to:
  store, by the storage, the detection results of the plurality of triaxial magnetic sensors in a prescribed period; and
  add, by the sign adder, the sign to the detection results from which the noise components have been removed based on the sign information of each of the detection results of the plurality of triaxial magnetic sensors at a point in time when a detection result whose an absolute value is maximized has been obtained among the detection results stored in the storage.

17. The non-transitory computer readable storage medium according to claim 15,
wherein the current measurement device further comprises a zero setter, and
wherein the one or more programs further instructs the current measurement device to:
  set, by the zero setter, a value of a detection result whose value is equal to or smaller than a preset threshold value among the detection results of the plurality of triaxial magnetic sensors to zero.

18. The non-transitory computer readable storage medium according to claim 15,
wherein the one or more programs further instructs the current measurement device to:
  individually perform, by the noise remover, averaging processing or square root of sum of squares processing on the detection results of respective axes of the plurality of triaxial magnetic sensors obtained at prescribed fixed periods to remove the noise components included in the detection results of the plurality of triaxial magnetic sensors.

19. The non-transitory computer readable storage medium according to claim 15,
wherein the current calculator comprises a distance estimator and a current calculator, and
wherein the one or more programs further instructs the current measurement device to:
  estimate, by the distance estimator, a distance between a prescribed reference position of the current measurement device and the measurement target conductor using the detection results to which the sign has been added by the sign adder; and
  calculate, by the current calculator, the current flowing through the measurement target conductor using the distance estimated by the distance estimator.

20. The non-transitory computer readable storage medium according to claim 15,
wherein the current measurement device further comprises:
  a sensor head comprising the plurality of triaxial magnetic sensors; and
  a circuit comprising at least the noise remover, the sign adder, and the current calculator.

* * * * *